United States Patent
Takahashi

(10) Patent No.: US 8,292,634 B2
(45) Date of Patent: Oct. 23, 2012

(54) SOCKET CONNECTOR HAVING A RECESS PROVIDED WITH A SPRING MEMBER ON A SIDE THEREOF

(75) Inventor: Takeshi Takahashi, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 141 days.

(21) Appl. No.: 12/928,309

(22) Filed: Dec. 8, 2010

(65) Prior Publication Data
US 2011/0195589 A1 Aug. 11, 2011

(30) Foreign Application Priority Data
Feb. 10, 2010 (JP) ................................ 2010-027945

(51) Int. Cl.
H01R 12/00 (2006.01)
(52) U.S. Cl. .................... 439/71; 439/607.1; 439/74
(58) Field of Classification Search .............. 439/70–71, 439/74, 607.1
See application file for complete search history.

(56) References Cited

U.S. PATENT DOCUMENTS

| | | | | |
|---|---|---|---|---|
| 3,910,664 A * | 10/1975 | Pauza et al. | ..................... | 439/71 |
| 4,222,622 A * | 9/1980 | Griffin et al. | .................... | 439/71 |
| 5,288,236 A * | 2/1994 | McIntyre | ........................ | 439/70 |
| 5,588,847 A * | 12/1996 | Tate | ................................. | 439/71 |
| 7,309,238 B2 * | 12/2007 | Yang | ................................ | 439/71 |
| 7,445,463 B2 * | 11/2008 | Tang et al. | ....................... | 439/71 |
| 7,497,733 B1 * | 3/2009 | Van der Steen | .......... | 439/607.01 |
| 7,510,402 B2 * | 3/2009 | Ma et al. | .......................... | 439/71 |
| 7,699,619 B2 * | 4/2010 | Mizumura | ...................... | 439/71 |

FOREIGN PATENT DOCUMENTS

| | | |
|---|---|---|
| JP | 2003-092168 | 3/2003 |
| JP | 2005-183295 | 7/2005 |
| JP | 2006-127804 | 5/2006 |

OTHER PUBLICATIONS

Japanese Office Action dated Nov. 9, 2011 in Japanese Patent Application No. 2010-027945 along with an English translation of the relevant parts.

* cited by examiner

Primary Examiner — Truc Nguyen
(74) Attorney, Agent, or Firm — Collard & Roe, P.C.

(57) ABSTRACT

A socket connector includes a socket body having a recess adapted to receive therein a connection object such as a semiconductor module, contact members disposed at a bottom surface portion of the recess, and a spring member disposed on one side of the recess. The spring member has an engaging portion adapted to engage the connection object in a detaching direction for provisionally holding it in a first stage of an attaching operation of the connection object and a pressing portion adapted to press the connection object parallel to the bottom surface portion and inward of the recess for positioning the connection object at a predetermined position of the recess.

20 Claims, 12 Drawing Sheets

US 8,292,634 B2

SOCKET CONNECTOR HAVING A RECESS PROVIDED WITH A SPRING MEMBER ON A SIDE THEREOF

This application is based upon and claims the benefit of priority from Japanese patent application No. 2010-027945, filed on Feb. 10, 2010, the disclosure of which is incorporated herein in its entirely by reference.

TECHNICAL FIELD

This invention relates to a socket connector for mounting a connection object such as an LGA (Land Grid Array) type semiconductor package on a circuit board or the like.

BACKGROUND ART

JP-A-2006-127804 (Patent Document 1) discloses such a socket connector which is called a socket therein. The socket has elastically deformable arms on two sides thereof, respectively, and is configured such that the connection object is pushed by these arms in directions parallel to a placement surface of the socket so as to be pressed against reference surfaces of the socket, thereby positioning the connection object.

JP-A-2003-092168 (Patent Document 2) discloses a miniaturized socket for connecting a connection object such as a plug connected to a communication cable. The socket has spring portions each having a locking piece at its fee end and is configured to prevent the connection object from being detached from a socket housing by engaging the locking pieces with the connection object. Positioning of the connection object is carried out using components other than the spring portions.

SUMMARY OF THE INVENTION

In consideration of the recent requirements for miniaturization and higher density of devices, assigning the connection object positioning function and the connection object holding function to the different components is disadvantageous in terms of ensuring space, strength, and so on because it increases the number of the components.

It is therefore an object of this invention to provide a socket connector that achieves connection object positioning and holding functions with a simple structure.

Other objects of the present invention will become clear as the description proceeds.

According to an exemplary aspect of the present invention, there is provided a socket connector which comprises a socket body having a recess adapted to receive therein a connection object, a plurality of contacts disposed at a bottom surface portion of the recess, and a spring member disposed on a side of the recess, wherein the spring member comprises an engaging portion adapted to engage the connection object in a detaching direction for provisionally holding the connection object in a first stage of an attaching operation of the connection object, and a pressing portion adapted to press the connection object parallel to the bottom surface portion and inward of the recess for positioning the connection object at a predetermined position of the recess in a second stage of the attaching operation.

According to another exemplary aspect of the present invention, there is provided a socket connector which comprises a socket body having a recess adapted to receive therein a connection object, a plurality of contacts disposed at a bottom surface portion of the recess, and a spring member disposed on a side of the recess, wherein the spring member comprises an engaging portion adapted to lock and provisionally hold the connection object at a first position spaced apart from the bottom surface portion, and a pressing portion adapted to position the connection object at a predetermined position of the recess at a second position closer to the bottom surface portion than the first position.

DESCRIPTION OF THE EMBODIMENT

Figure 1A:
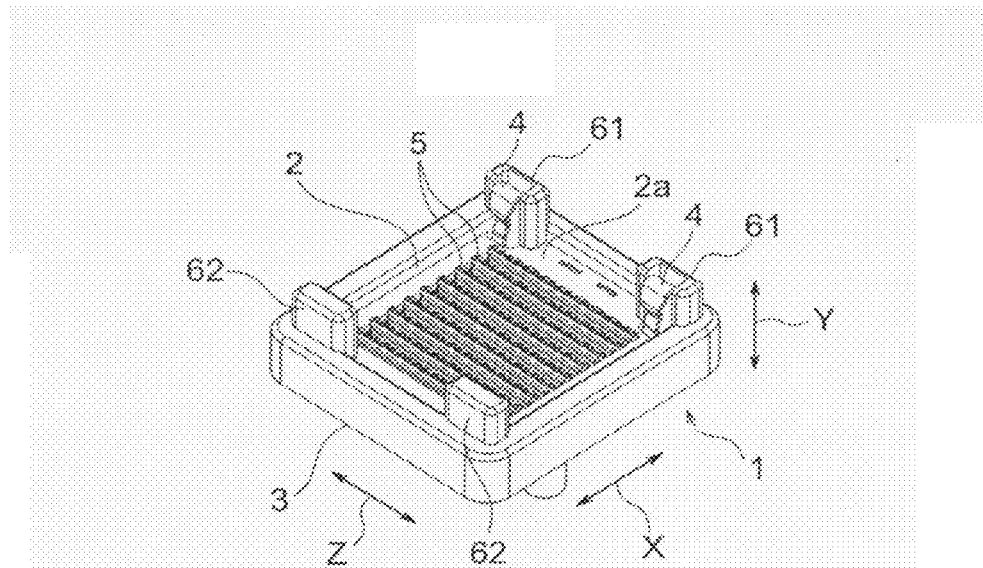
FIG. 1A is a perspective view as seen from one upper side of a socket connector according to an embodiment of this invention.

Referring first to FIGS. 1A to 7, the structure of a socket connector 1 according to an embodiment of this invention will be described.

In FIGS. 1A to 1C and 2, the socket connector 1 is for mounting a connection object such as an LGA (Land Grid Array) type or BGA (Ball Grid Array) type semiconductor module on a circuit board or the like. The socket connector 1 comprises a socket body 3 having, at the center of its upper surface, a recess 2 of a generally square shape in plan view adapted to receive therein the connection object, a spring member 4 incorporated at one side portion, in a first direction X, of the recess 2 for obtaining a connection object positioning function and a connection object holding function, and a plurality of contact members 5 incorporated in a bottom surface portion 2a of the recess 2 for electrically connecting the connection object. Herein, the socket body 3 and the contact members 5 combined together are simply called a "socket".

The socket body 3 is formed of an insulating plastic molding material. The socket body 3 has four module-guide supports (hereinafter simply referred to as "supports") 61 and 62 provided corresponding to four corners of the recess 2, respectively. Each of the supports 61 and 62 extends upward from the bottom surface portion 2a in a second direction Y perpendicular to the first direction X. As will be described in detail later, the two supports 61 on one end side contribute to the incorporation of the spring member 4 while the two supports 62 on the opposite end side contribute to obtaining the connection object positioning and holding functions.

Figure 3:
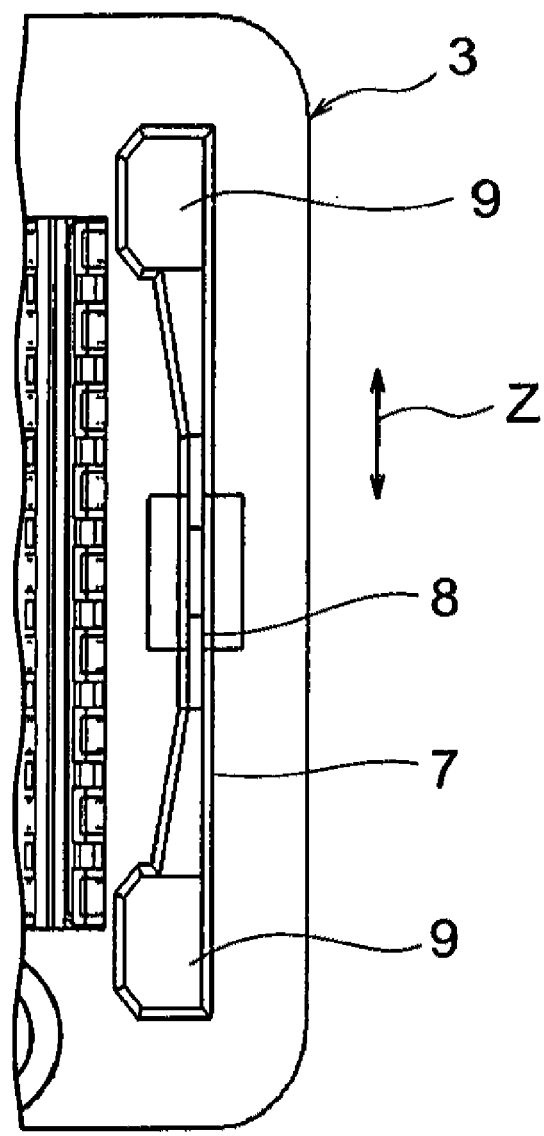
FIG. 3 is a bottom view showing only a part of the socket shown in FIG. 2.

Further, as shown in FIG. 3, the socket body 3 is provided at its one end portion in the first direction X with a spring incorporating portion 7 for incorporating the spring member 4. The spring incorporating portion 7 has a press-fit hole 8 formed at its middle portion in a third direction Z and insertion holes 9 formed at its both end portions corresponding to the two supports 61 on the one end side.

Figure 1B:
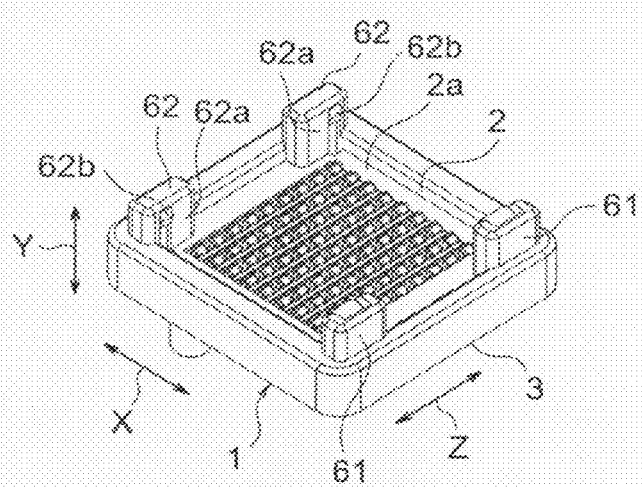
FIG. 1B is a perspective view as seen from another upper side of the socket connector of FIG. 1A.
Figure 1C:
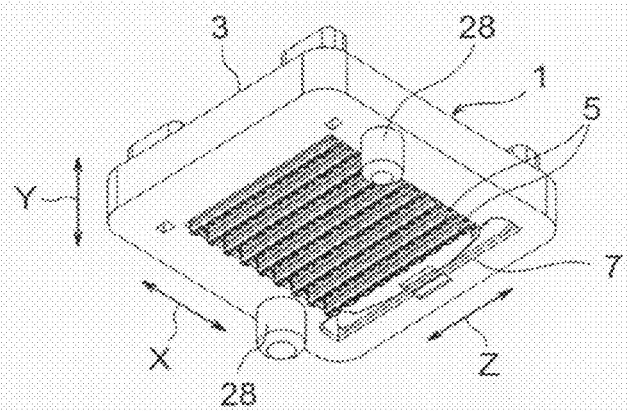
FIG. 1C is a perspective view as seen from a lower side of the socket connector of FIGS. 1A and 1B.
Figure 2:
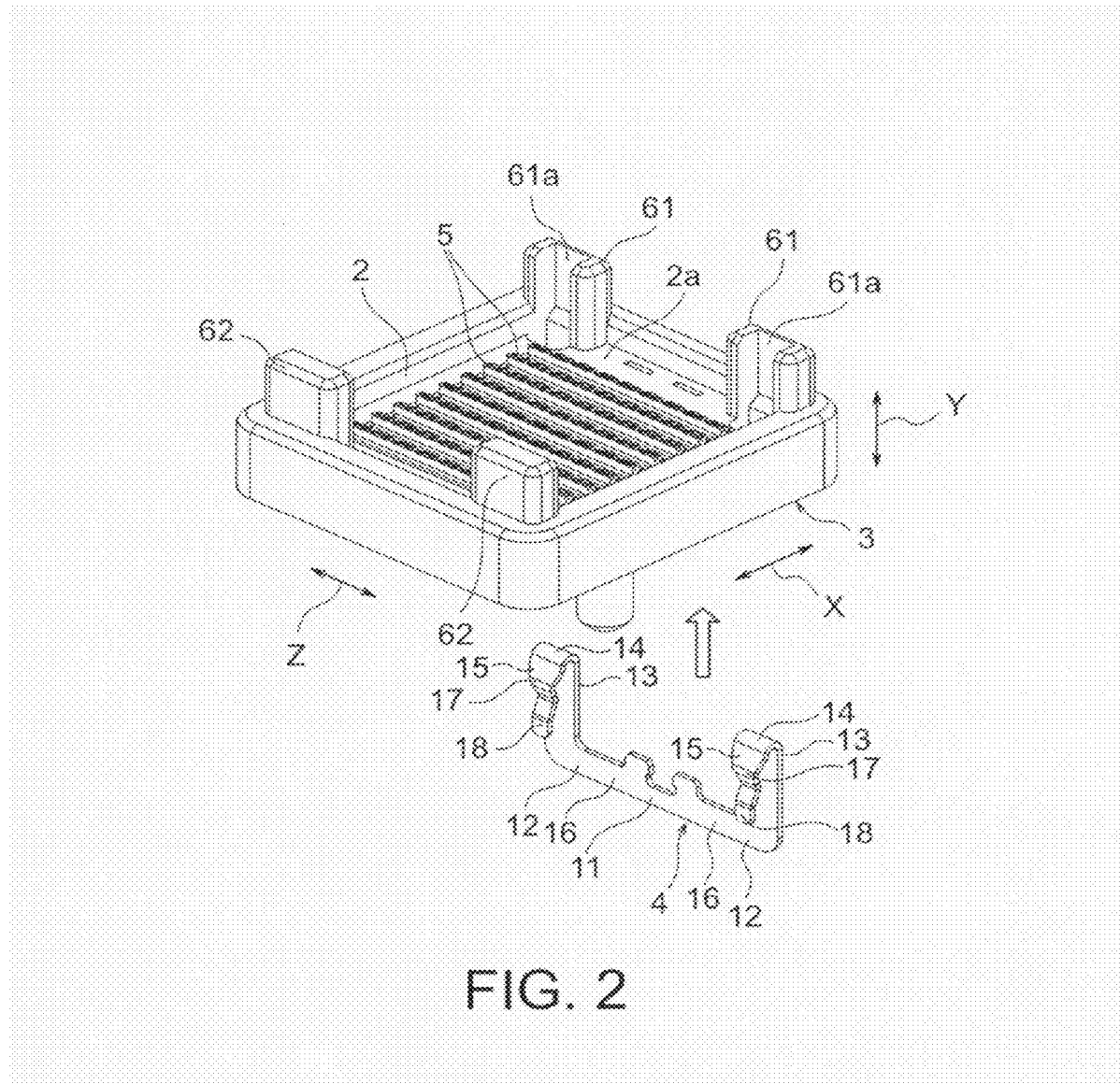
FIG. 2 is a perspective view showing, in a disassembled state, a socket and a spring member included in the socket connector of FIGS. 1A to 1C.

As shown in FIG. 1B, each of the two supports 62 on the opposite end side of the socket body 3 is provided with a positioning reference surface 62a and an engaging projection 62b facing the corresponding support 61 on the one end side with a distance therebetween.

Figure 4A:
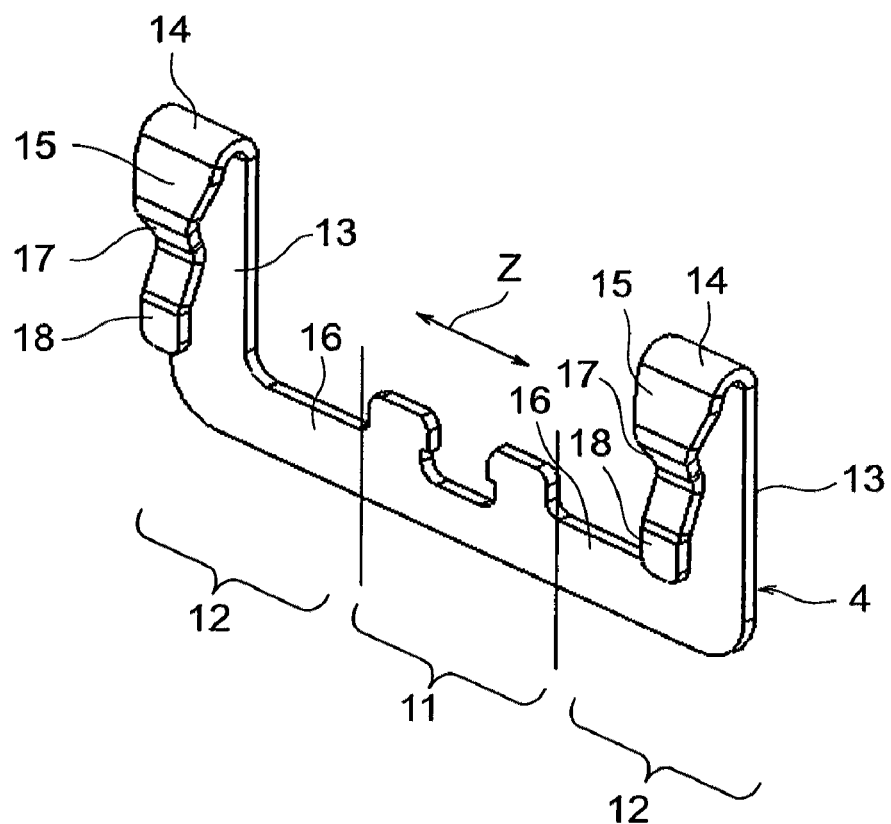
FIG. 4A is an enlarged perspective view of the spring member shown in FIG. 2.
Figure 4B:
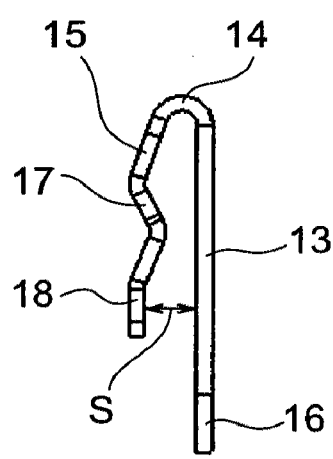
FIG. 4B is a side view of the spring member shown in FIG. 4A.

As shown in FIGS. 4A and 4B, the spring member 4 has a press-fit portion 11 at its middle portion in the third direction Z, which is press-fitted into the press-fit hole 8, and further has spring portions 12 at its both end portions, respectively. Each spring portion 12 has an L-shape with a horizontal portion and a vertical portion, wherein the vertical portion is formed such that its upper part is folded back. This foldedback part has springiness and thus is deformable, and therefore, the upper part of the vertical portion is folded back by ensuring a space S necessary for deformation of the foldedback part as shown in FIG. 4B.

The spring member 4 has a pair of first spring pieces 13 extending vertically, a pair of folded-back portions 14 each folded back to one side from an upper end of the first spring piece 13, a pair of second spring pieces 15 each extending downward from the folded-back portion 14, and a pair of third spring pieces 16 each extending horizontally between the press-fit portion 11 and a lower end of the first spring piece 13. Further, an engaging portion 17 and a pressing portion 18 are formed extending from a lower end of each second spring piece 15. When incorporating the spring member 4 into the socket body 3, the first spring pieces 13 are inserted through the insertion holes 9 so as to be disposed on the inside of the supports 61 on the one end side of the socket body 3. As a result, the second spring pieces 15, the engaging portions 17, and the pressing portions 18 are exposed above the bottom surface portion 2a of the recess 2 in a posture facing the supports 62 on the opposite end side of the socket body 3 with a distance therebetween.

In this embodiment, the two spring portions 12 are formed symmetrically with each other, but a single spring portion 12 may be formed only on one side. Further, the spring member 4 is formed by punching and bending a metal plate in this embodiment, but may be formed of a plastic material.

Figure 5A:
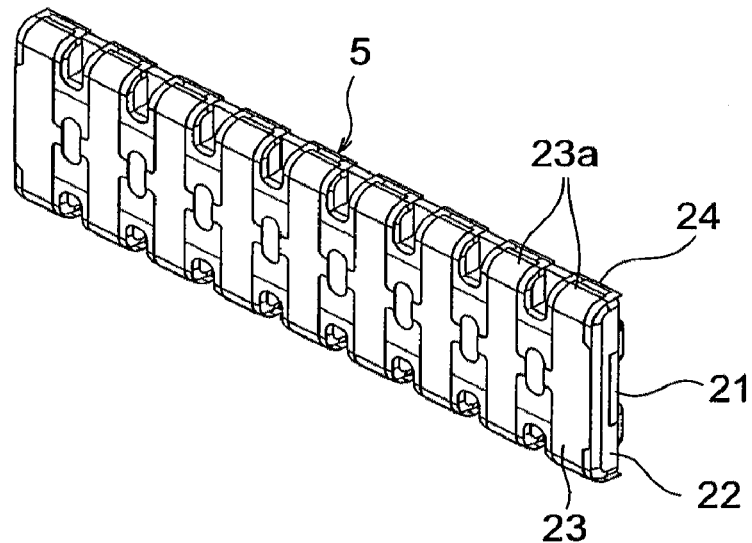
FIG. 5A is a perspective view as seen from one side of a contact member included in the socket shown in FIG. 2.
Figure 5B:
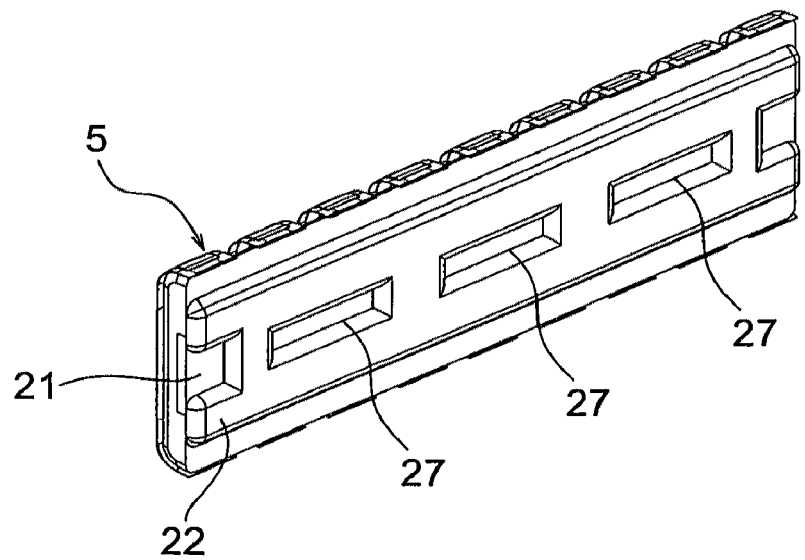
FIG. 5B is a perspective view as seen from another side of the contact member shown in FIG. 5A.
Figure 6:
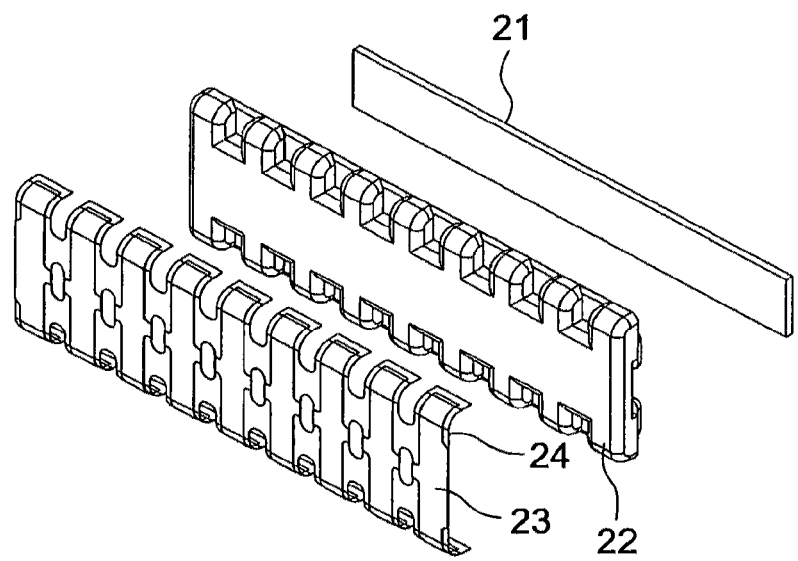
FIG. 6 is an explanatory perspective view for explaining the structure of the contact member shown in FIGS. 5A and 5B.

As shown in FIGS. 5A to 6, each contact member 5 is formed using a base member 21 for reinforcement and transfer, a viscoelastic member 22 made of gel, rubber, or the like, and an insulating film 24 of several μm to ten and several μm thick made of polyimide or the like and formed on its surface with conductors 23 the number of which corresponds to the number of pins. First, the viscoelastic member 22 is formed so as to surround the base member 21, thereby holding the base member 21. Then, the insulating film 24 is fixedly bonded to the viscoelastic member 22 using an adhesive or the like. The conductors 23 are patterned in advance on the surface of the insulating film 24 by sputtering, plating, etching, or the like. In this manner, each contact member 5 is configured as a low-pressure contact having a plurality of contact portions 23a on its upper and lower end faces. General press contacts may be used instead of the contact members 5.

Figure 7:
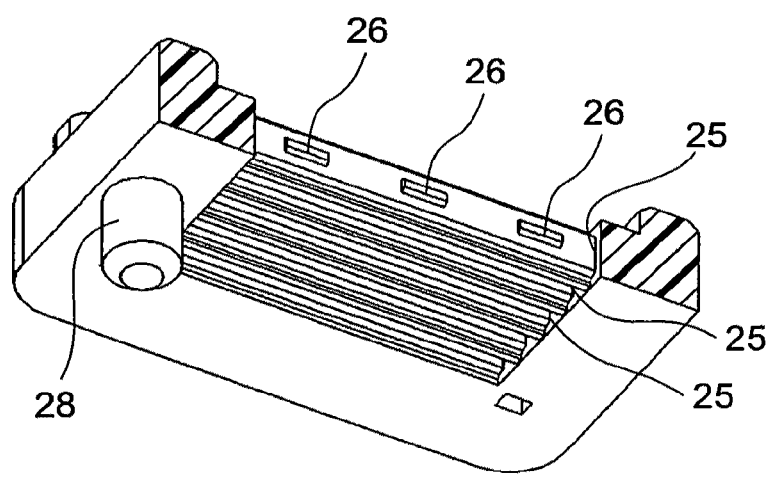
FIG. 7 is a cross-sectional perspective view of a socket body included in the socket shown in FIG. 2.

As shown in FIG. 7, the bottom surface portion 2a of the recess 2 of the socket body 3 has a plurality of slits 25 extending parallel to each other in the third direction Z and a plurality of projections 26 located in each slit 25. The contact members 5 are inserted into the respective slits 25 so as to be disposed in the socket body 3 in a state where the contact members 5 are adjacent to each other in the first direction X. The contact members 5 are held by the socket body 3 by engagement between the projections 26 of the socket body 3 and recesses 27 provided at corresponding positions of the contact members 5. Since the contact members 5 are disposed in a state where the contact members 5 project upward and downward from the bottom surface portion 2a of the recess 2 of the socket body 3, the contact portions 23a are exposed upward and downward in a matrix from the bottom surface portion 2a. This state can also be regarded as a state where a number of contacts are disposed in a matrix at the bottom surface portion 2a of the recess 2 of the socket body 3. On a lower surface of the socket body 3, a plurality of positioning bosses 28 are provided for positioning the socket connector 1 with respect to the board when mounting the socket connector 1 on the board.

The number of pins of the socket connector 1 can be arbitrarily designed depending on the number of the slits 25 or the contact members 5. For example, when 9 contact members 5 each having 9 conductors 23 are inserted in the socket body 3, the 81-pin socket connector 1 is obtained.

Figure 8A:
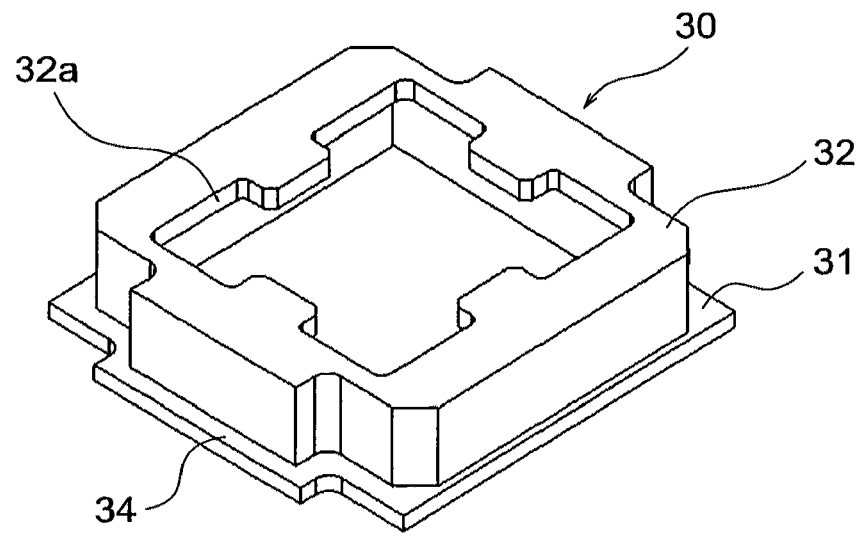
FIG. 8A is a perspective view as seen from an upper side of a connection object connectable to the socket connector of FIGS. 1A to 1C.
Figure 8B:
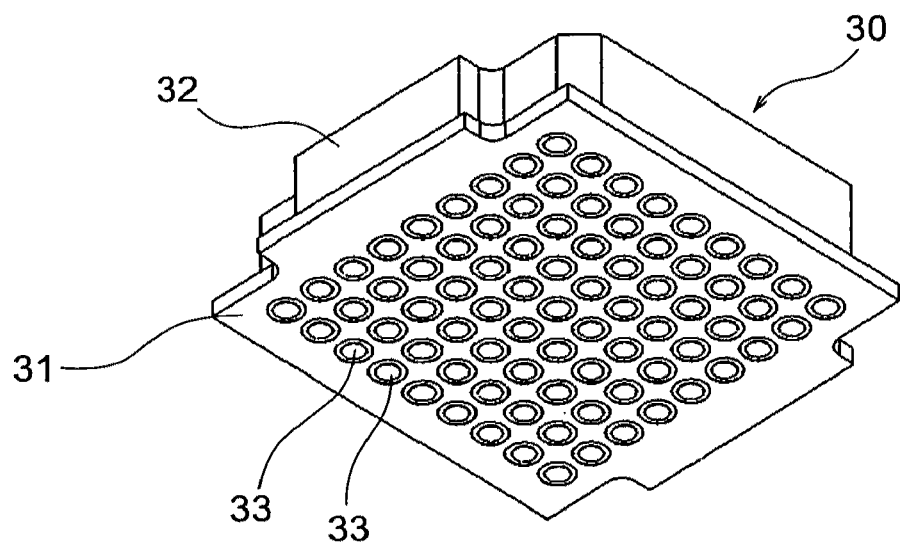
FIG. 8B is a perspective view as seen from a lower side of the connection object of FIG. 8A.

Referring now to FIGS. 8A and 8B, a semiconductor module 30 as the connection object will be briefly described.

The semiconductor module 30 comprises an LGA substrate 31 and a semiconductor package 32 having semiconductor elements and fixedly mounted on an upper surface of the LGA substrate 31. A number of terminals 33 are arranged in a matrix in a lower surface of the LGA substrate 31. The semiconductor package 32 is formed in its upper surface with an opening 32a for drawing out an optical fiber.

Now, referring also to FIGS. 9A to 11, a description will be given of an operation of attaching the semiconductor module 30 to the above-mentioned socket connector 1.

Since both spring portions 12 of the spring member 4 operate in the same manner, the following description will be given of only one of the spring portions 12 for the sake of clarity and simplicity.

Figure 9A:
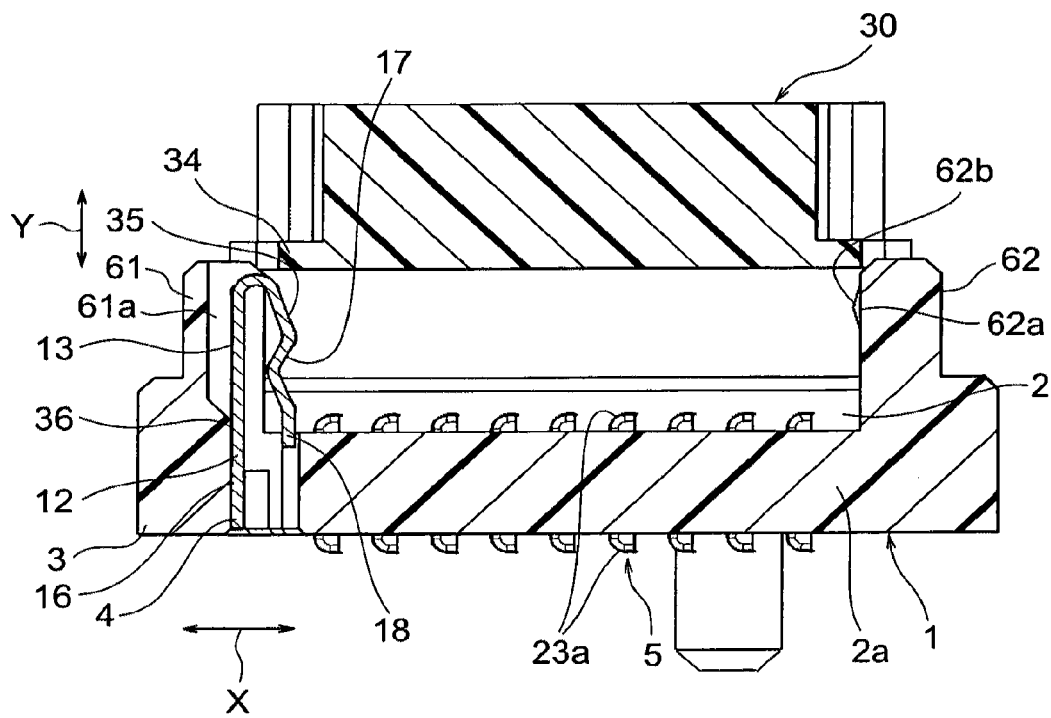
FIG. 9A is a cross-sectional view showing a starting stage of an operation of attaching the connection object of FIGS. 8A and 8B to the socket connector of FIGS. 1A to 1C.
Figure 9B:
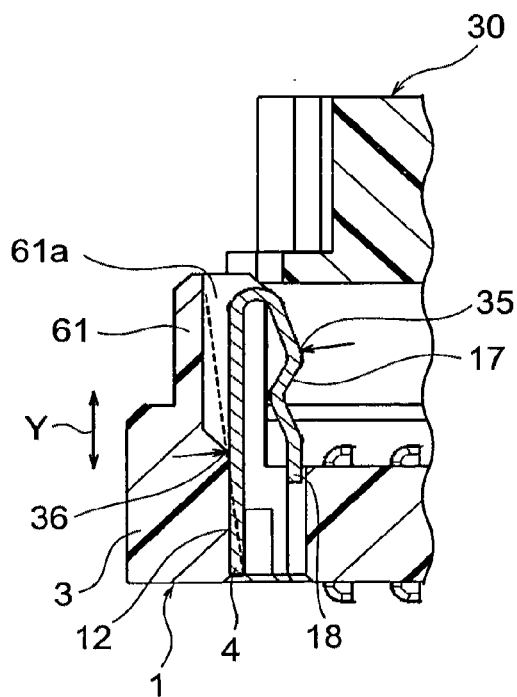
FIG. 9B is an explanatory diagram for explaining a state of the spring member when the attaching operation proceeds from the starting stage of FIG. 9A.

In FIGS. 9A and 9B, the semiconductor module 30 is attached to the socket connector 1 from above. First, the engaging portion 17 of the spring member 4 is pushed by a flange portion 34, being a peripheral portion of the LGA substrate 31, of the semiconductor module 30. In this event, as shown in FIG. 9B, a pressure point 35 to the spring portion 12 and a deformation suppression portion 36 provided as a support portion to the socket body 3 are largely offset in position from each other in the second direction Y. Therefore, as indicated by a thick broken line in FIG. 9B, an upper part of the spring portion 12 is inclined outward (to the left in FIG. 9B) using an upper end of the deformation suppression portion 36 as a fulcrum. In this event, a lower part of the spring portion 12 is deformed to the right in FIG. 9B like a lever using the upper end of the deformation suppression portion 36 as a fulcrum. Therefore, the whole of the L-shaped portion of the spring portion 12 is deformed in a twisted manner to generate a reaction force. In order to allow the deformation of the upper part of the spring portion 12, the support 61 is formed with an escape recess 61a.

That is, in the first stage of the attaching operation where the flange portion 34 of the semiconductor module 30 is caused to push the engaging portion 17, an upper part of the first spring piece 13 (and the second spring piece 15) are elastically deformed inward of the escape recess 61a while a lower part of the first spring piece 13 (and the third spring piece 16) are elastically deformed in a direction opposite thereto, i.e. outward of the escape recess 61a, using as a fulcrum the upper end of the deformation suppression portion 36 serving as the support portion, so that the whole of the first spring piece 13 and the second spring piece 15 (and the third spring piece 16) functions as a spring. The lower part of the first spring piece 13 and the third spring piece 16 are deformed to the right in FIG. 9B using the support portion and the fixing portion as a fulcrum and, as a result, the second spring piece 15 and the third spring piece 16 are deformed in a twisted manner.

Figure 10A:
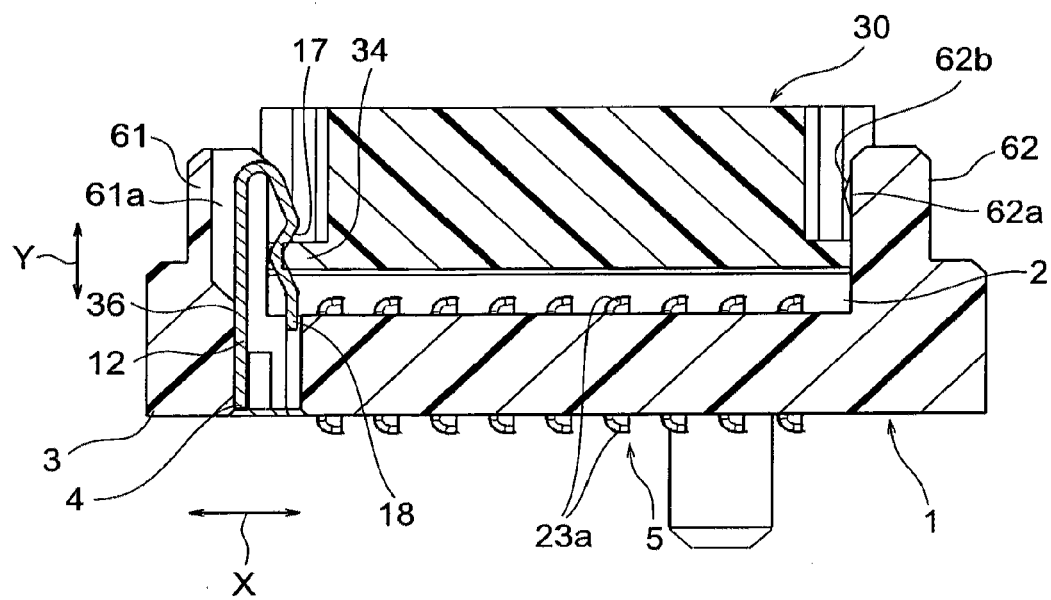
FIG. 10A is a cross-sectional view showing a first stage where the operation of attaching the connection object of FIGS. 8A and 8B to the socket connector of FIGS. 1A to 1C has further proceeded.
Figure 10B:
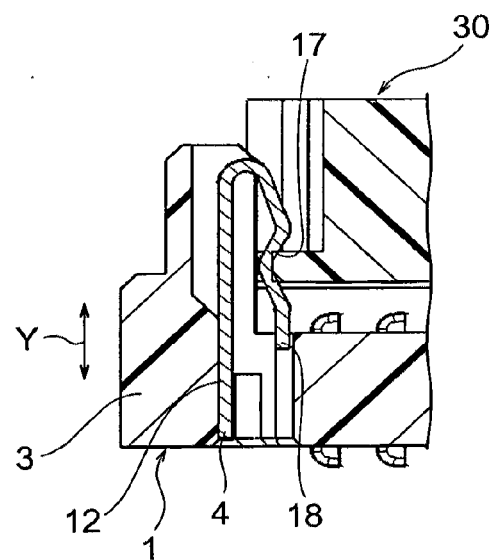
FIG. 10B is an explanatory diagram for explaining a state of the spring member when the attaching operation proceeds from the first stage of FIG. 10A.

When the attaching operation of the semiconductor module 30 further proceeds, the flange portion 34 rides over the engaging portion 17 and the engaging projection 62b of the support 62 to enter a recessed portion of the engaging portion 17. As a result, as shown in FIGS. 10A and 10B, one end portion of the flange portion 34 engages the engaging portion 17 in the second direction Y. Simultaneously, an opposite end portion of the flange portion 34 is pressed against the positioning reference surface 62a of the support 62 due to a reaction force of the spring portion 12 and engages the engaging projection 62b in the second direction Y. As a result, the semiconductor module 30 is provisionally held with its posture being controlled at a first position spaced apart from the bottom surface portion 2a of the recess 2 of the socket body 3. In this manner, the semiconductor module 30 is prevented from coming off by the springiness of the spring portion 12 when the semiconductor module 30 is received in the recessed portion formed between the engaging portion 17 and the pressing portion 18 of the spring member 4 as shown in FIGS. 10A and 10B.

Herein, "provisional holding" represents weak holding of a degree such that the semiconductor module 30 does not come off even if the socket connector 1 is turned upside down. By changing the shape of the spring portion 12, it is possible to provide "provisional holding" or a holding force that does not allow the semiconductor module 30 to be detached only by pulling it upward. In this embodiment, the shape of the spring portion 12 is adapted to obtain a holding force of "provisional holding" and, therefore, it is possible to detach the semiconductor module 30 by displacing it to the left in FIGS. 10A and 10B.

When the semiconductor module 30 is further depressed from the above-mentioned state, the semiconductor module 30 is, with deformation of the spring member 4, pressed against the positioning reference surface 62a of the support 62 on the right side in FIG. 10A for positioning thereof.

Figure 11:
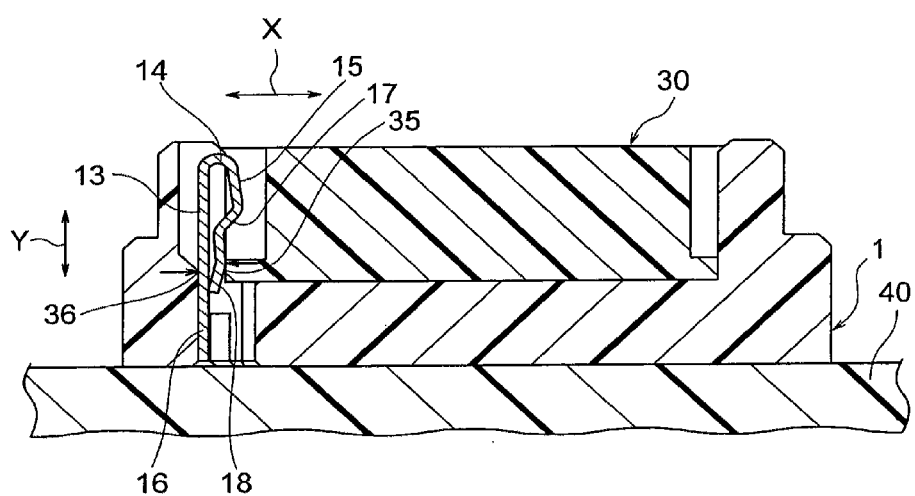
FIG. 11 is a cross-sectional view showing a second stage where the operation of attaching the connection object of FIGS. 8A and 8B to the socket connector of FIGS. 1A to 1C has further proceeded.

When the semiconductor module 30 is further moved down to a position of FIG. 11, the pressure point 35 and the spring deformation suppression portion 36 substantially coincide in position with each other in the second direction Y so that the spring portion 12 obtains springiness basically by the folded-back portion 14. Accordingly, the semiconductor module 30 is positioned and held at a predetermined position of the recess 2 at a second position closer to the bottom surface portion 2a of the recess 2 than the above-mentioned first position. In other words, in the second stage of the attaching operation where the semiconductor module 30 is finally attached, since a reaction force applied to the first spring piece 13 by the pressing portion 18 is received by the support portion, i.e. the deformation suppression portion 36, the upper part, above the support portion, of the first spring piece 13 functions as a spring so that the spring length is shortened to cause the pressing portion 18 to position and hold the semiconductor module 30 with a strong pressing force (spring force). In FIG. 11, numeral 40 denotes the board on which the socket connector 1 is mounted.

As described above, the socket connector 1 is configured such that use is made of the inverse U-shaped spring member 4 having the first spring piece 13 and the second spring piece 15 facing each other through the folded-back portion 14, wherein the second spring piece 15 facing the recess 2 of the socket body 3 is provided with the engaging portion 17 adapted to provisionally hold the semiconductor module 30 and with the pressing portion 18 adapted to push and move the semiconductor module 30 parallel to the bottom surface portion 2a of the recess 2 to thereby position the semiconductor module 30 at the predetermined position of the recess 2 and a portion, opposed to the pressing portion 18, of an outer surface of the first spring piece 13 is supported by the spring deformation suppression portion 36. According to this configuration, in the first stage of the attaching operation where the semiconductor module 30 is caused to engage the engaging portion 17 for provisional holding thereof, the upper part of the first spring piece 13 is elastically deformed outward while the lower part of the first spring piece 13 is elastically deformed inward, using the spring deformation suppression portion 36 as a fulcrum, so that the whole of the first spring piece 13 functions as a spring to facilitate the engagement (provisional holding) of the semiconductor module 30. Then, in the second stage of the attaching operation where the semiconductor module 30 is moved to the pressing portion 18 for positioning thereof, only the upper part, above the spring deformation suppression portion 36, of the first spring piece 13 functions as a spring so that the spring length is shortened and thus a strong spring force necessary for pushing and moving the semiconductor module 30 is obtained. Further, by providing the third spring piece 16, which is parallel to the bottom surface portion 2a of the recess 2, at the lower end of the first spring piece 13, the spring length at the time of the engagement of the semiconductor module 30 can be made longer so that it is possible to further facilitate the engagement of the semiconductor module 30 and to suppress the height of the entire socket connector 1.

Figure 12:
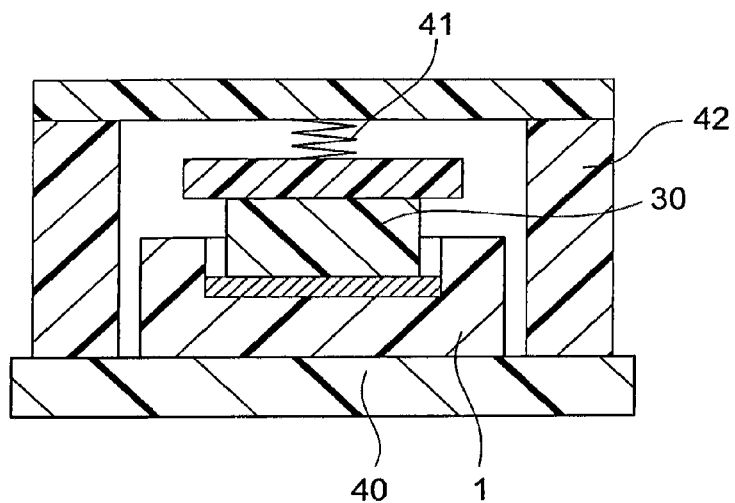
FIG. 12 is an exemplary diagram showing one example of a mechanism for use in connecting the connection object of FIGS. 8A and 8B to the socket connector of FIGS. 1A to 1C.
Figure 13:
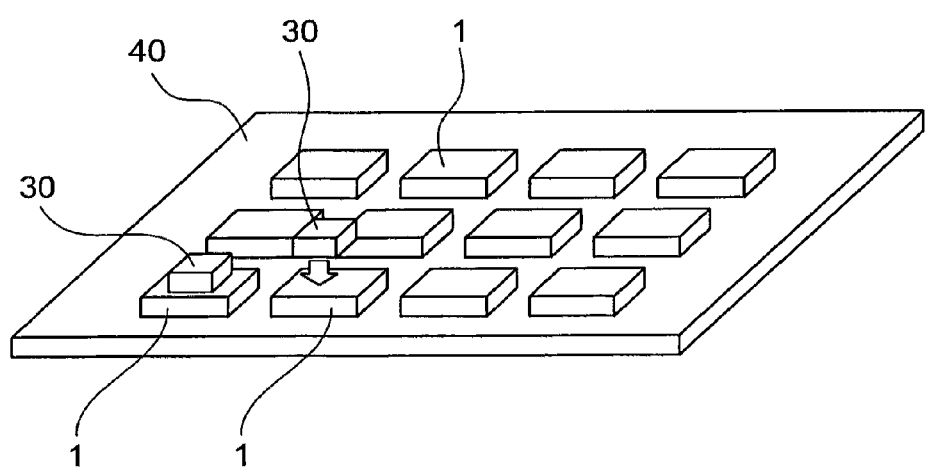
FIG. 13 is an exemplary diagram showing one example in which a number of socket connectors each being the socket connector of FIGS. 1A to 1C are mounted on a single board.
Figure 14:
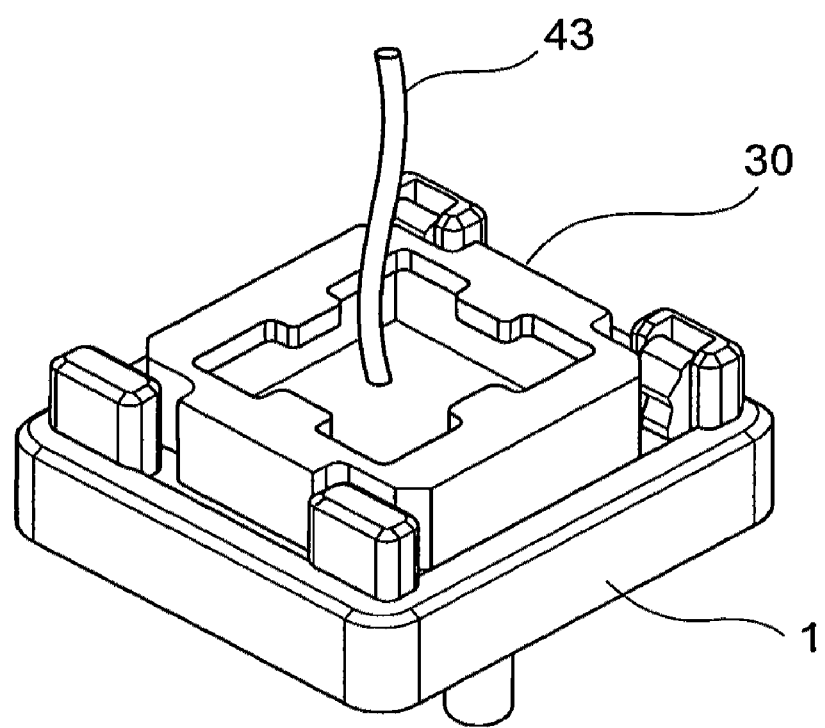
FIG. 14 is a perspective view showing another example of a connection object in a state where it is connected to the socket connector of FIGS. 1A to 1C.

In the above-mentioned embodiment, the acting direction of a spring force by the spring member 4 is only the first direction X, but another spring member may be added to produce a spring force that acts in the third direction Z. On the other hand, in addition to the spring member 4 disposed at the supports 61 on the one end side, the same spring member as the spring member 4 may be disposed at the supports 62 on the opposite end side instead of the engaging projections 62b. Final connection of the semiconductor module 30 to the socket connector 1 is carried out using a pressing mechanism 42 having a spring 41 as shown in FIG. 12 or using a module pressing cover mounted over the socket connector 1. As shown in FIG. 13, it may be considered to mount a plurality of socket connectors 1 on a single board 40, then to set semiconductor modules 30 in the socket connectors 1, respectively, and then to press down the semiconductor modules 30 collectively at a time. As shown in FIG. 14, there is also a case where an optical module with an optical fiber 43 being drawn out is connected as the semiconductor module 30 to the socket connector 1. In any of the cases, in terms of handling, the socket connector 1 is preferably provided with the function of provisionally holding the semiconductor module 30.

While the description has been given of the case where the semiconductor module 30 is used as a connection object, it is needless to say that this invention is not limited thereto and that various other things can be used as connection objects.

The above-mentioned socket connector can be used for connecting an LGA type or BGA type semiconductor module such as a CPU or an O/E conversion module.

The above-mentioned socket connector is such that the spring member is disposed on a side of the recess adapted to receive therein the connection object and is provided with the engaging portion adapted to engage the connection object for provisionally holding it and with the pressing portion adapted to press the connection object in a direction parallel to the bottom surface portion of the recess for positioning the connection object at the predetermined position, thereby achieving both the provisional holding and the positioning with the single spring member.

This invention is not limited to the above-mentioned embodiment and part or the whole thereof can also be described as the following supplementary notes but is not limited thereto.

(Supplementary Note 1) A socket connector 1 comprising:
a socket body 3 having a recess 3 adapted to receive therein a connection object;
a plurality of contacts 5 disposed at a bottom surface portion 2a of the recess; and
a spring member 4 disposed on a side of the recess,
wherein the spring member comprises:
an engaging portion 17 adapted to engage the connection object in a detaching direction for provisionally holding the connection object in a first stage of an attaching operation of the connection object; and
a pressing portion 18 adapted to press the connection object parallel to the bottom surface portion and inward of the recess for positioning the connection object at a predetermined position of the recess in a second stage of the attaching operation.

(Supplementary Note 2) The socket connector according to supplementary note 1, wherein the spring member comprises:
a first spring piece 13 rising from a bottom surface portion side of the recess; and a second spring piece 15 being continuous with the first spring piece and extending to the bottom surface portion side of the recess through a folded-back portion, and
wherein the second spring piece faces the recess and is formed with the engaging portion and the pressing portion.

(Supplementary Note 3) The socket connector according to supplementary note 2, wherein the spring member further comprises a third spring piece 16 being continuous with an end portion, on the bottom surface portion side, of the first spring piece and extending parallel to the bottom surface portion and the third spring piece has one end fixed to the socket body and is elastically deformable in a direction parallel to the bottom surface portion.

(Supplementary Note 4) The socket connector according to supplementary note 3, wherein the socket body comprises a support portion 36 being in contact with an intermediate portion of a surface, facing outward of the recess, of the first spring piece and, when an upper part, above the support portion, of the first spring piece is elastically deformed outward of the recess, the support portion serves as a fulcrum so that a lower part, below the fulcrum, of the first spring piece is elastically deformed inward of the recess.

(Supplementary Note 5) The socket connector according to supplementary note 4, wherein the support portion is provided at a position facing the pressing portion of the spring member.

(Supplementary Note 6) The socket connector according to supplementary note 1, wherein the spring member is provided on one side of the recess and a positioning reference surface 62a is provided on another side of the recess, the positioning reference surface being adapted to be pressed with a peripheral portion of the connection object by the pressing portion of the spring member, thereby positioning the connection object at the predetermined position of the recess.

(Supplementary Note 7) The socket connector according to supplementary note 6, wherein the positioning reference surface is provided with an engaging projection 62b which the connection object engages in the detaching direction and which cooperates with the engaging portion of the spring member to provisionally hold the connection object.

(Supplementary Note 8) The socket connector according to supplementary note 6, wherein the connection object has a flange portion 34 at the peripheral portion and the flange portion engages the engaging portion and/or the engaging projection and is pressed by the pressing portion so as to be positioned at the predetermined position of the recess.

(Supplementary Note 9) The socket connector according to supplementary note 6, wherein the spring member comprises:
a first spring piece 13 rising from a bottom surface portion side of the recess;
a second spring piece 15 being continuous with the first spring piece and extending to the bottom surface portion side of the recess through a folded-back portion, and
a third spring piece 16 being continuous with an end portion, on the bottom surface portion side, of the first spring piece and extending parallel to the bottom surface portion.

(Supplementary Note 10) The socket connector according to supplementary note 9, wherein:
the second spring piece faces the recess and is formed with the engaging portion and the pressing portion;
the third spring piece has one end fixed to the socket body and is elastically deformable in a direction parallel to the bottom surface portion;
the socket body comprises a support portion 36 being in contact with an intermediate portion of a surface, facing outward of the recess, of the first spring piece;

when an upper part, above the support portion, of the first spring piece is elastically deformed outward of the recess, the support portion serves as a fulcrum so that a lower part, below the fulcrum, of the first spring piece is elastically deformed inward of the recess; and the support portion is provided at a position facing the pressing portion of the spring member.

(Supplementary Note 11) A socket connector comprising:
a socket body 3 having a recess 2 adapted to receive therein a connection object;
a plurality of contacts 5 disposed at a bottom surface portion of the recess; and
a spring member 4 disposed on a side of the recess,
wherein the spring member comprises:
an engaging portion 17 adapted to lock and provisionally hold the connection object at a first position spaced apart from the bottom surface portion; and
a pressing portion 18 adapted to position the connection object at a predetermined position of the recess at a second position closer to the bottom surface portion than the first position.

(Supplementary Note 12) The socket connector according to supplementary note 11, wherein the spring member comprises:
a first spring piece 13 rising from a bottom surface portion side of the recess; and
a second spring piece 15 being continuous with the first spring piece and extending to the bottom surface portion side of the recess through a folded-back portion, and
wherein the second spring piece faces the recess and is formed with the engaging portion and the pressing portion.

(Supplementary Note 13) The socket connector according to supplementary note 12, wherein the spring member further comprises a third spring piece 16 being continuous with an end portion, on the bottom surface portion side, of the first spring piece and extending parallel to the bottom surface portion and the third spring piece has one end fixed to the socket body and is elastically deformable in a direction parallel to the bottom surface portion.

(Supplementary Note 14) The socket connector according to supplementary note 13, wherein the socket body comprises a support portion 36 being in contact with an intermediate portion of a surface, facing outward of the recess, of the first spring piece and, when an upper part, above the support portion, of the first spring piece is elastically deformed outward of the recess, the support portion serves as a fulcrum so that a lower part, below the fulcrum, of the first spring piece is elastically deformed inward of the recess.

(Supplementary Note 15) The socket connector according to supplementary note 14, wherein the support portion is provided at a position facing the pressing portion of the spring member.

(Supplementary Note 16) The socket connector according to supplementary note 11, wherein the spring member is provided on one side of the recess and a positioning reference surface 62a is provided on another side of the recess, the positioning reference surface being adapted to be pressed with a peripheral portion of the connection object by the pressing portion of the spring member, thereby positioning the connection object at the predetermined position of the recess.

(Supplementary Note 17) The socket connector according to supplementary note 16, wherein the positioning reference surface 62b is provided with an engaging projection which the connection object engages in a detaching direction and which cooperates with the engaging portion of the spring member to provisionally hold the connection object.

(Supplementary Note 18) The socket connector according to supplementary note 16, wherein the connection object has a flange portion 34 at the peripheral portion and the flange portion engages the engaging portion and/or the engaging projection and is pressed by the pressing portion so as to be positioned at the predetermined position of the recess.

(Supplementary Note 19) The socket connector according to supplementary note 11, wherein the spring member comprises:
a first spring piece 13 rising from a bottom surface portion side of the recess;
a second spring piece 15 being continuous with the first spring piece and extending to the bottom surface portion side of the recess through a folded-back portion, and
a third spring piece 16 being continuous with an end portion, on the bottom surface portion side, of the first spring piece and extending parallel to the bottom surface portion.

(Supplementary Note 20) The socket connector according to supplementary note 19, wherein:
the second spring piece faces the recess and is formed with the engaging portion and the pressing portion;
the third spring piece has one end fixed to the socket body and is elastically deformable in a direction parallel to the bottom surface portion;
the socket body comprises a support portion 36 being in contact with an intermediate portion of a surface, facing outward of the recess, of the first spring piece;
when an upper part, above the support portion, of the first spring piece is elastically deformed outward of the recess, the support portion serves as a fulcrum so that a lower part, below the fulcrum, of the first spring piece is elastically deformed inward of the recess; and
the support portion is provided at a position facing the pressing portion of the spring member.

What is claimed is:

1. A socket connector comprising:
a socket body having a recess adapted to receive therein a connection object;
a plurality of contacts disposed at a bottom surface portion of the recess; and
a spring member disposed on a side of the recess,
wherein the spring member comprises:
an engaging portion adapted to engage the connection object in a detaching direction for provisionally holding the connection object in a first stage of an attaching operation of the connection object; and
a pressing portion adapted to press the connection object parallel to the bottom surface portion and inward of the recess for positioning the connection object at a predetermined position of the recess in a second stage of the attaching operation.

2. The socket connector according to claim 1, wherein the spring member comprises:
a first spring piece rising from a bottom surface portion side of the recess; and
a second spring piece being continuous with the first spring piece and extending to the bottom surface portion side of the recess through a folded-back portion, and
wherein the second spring piece faces the recess and is formed with the engaging portion and the pressing portion.

3. The socket connector according to claim 2, wherein the spring member further comprises a third spring piece being continuous with an end portion, on the bottom surface portion side, of the first spring piece and extending parallel to the bottom surface portion and the third spring piece has one end fixed to the socket body and is elastically deformable in a direction parallel to the bottom surface portion.

4. The socket connector according to claim 3, wherein the socket body comprises a support portion being in contact with an intermediate portion of a surface, facing outward of the recess, of the first spring piece and, when an upper part, above the support portion, of the first spring piece is elastically deformed outward of the recess, the support portion serves as a fulcrum so that a lower part, below the fulcrum, of the first spring piece is elastically deformed inward of the recess.

5. The socket connector according to claim 4, wherein the support portion is provided at a position facing the pressing portion of the spring member.

6. The socket connector according to claim 1, wherein the spring member is provided on one side of the recess and a positioning reference surface is provided on another side of the recess, the positioning reference surface being adapted to be pressed with a peripheral portion of the connection object by the pressing portion of the spring member, thereby positioning the connection object at the predetermined position of the recess.

7. The socket connector according to claim 6, wherein the positioning reference surface is provided with an engaging projection which the connection object engages in the detaching direction and which cooperates with the engaging portion of the spring member to provisionally hold the connection object.

8. The socket connector according to claim 6, wherein the connection object has a flange portion at the peripheral portion and the flange portion engages the engaging portion and/or the engaging projection and is pressed by the pressing portion so as to be positioned at the predetermined position of the recess.

9. The socket connector according to claim 6, wherein the spring member comprises:
a first spring piece rising from a bottom surface portion side of the recess;
a second spring piece being continuous with the first spring piece and extending to the bottom surface portion side of the recess through a folded-back portion, and
a third spring piece being continuous with an end portion, on the bottom surface portion side, of the first spring piece and extending parallel to the bottom surface portion.

10. The socket connector according to claim 9, wherein:
the second spring piece faces the recess and is formed with the engaging portion and the pressing portion;
the third spring piece has one end fixed to the socket body and is elastically deformable in a direction parallel to the bottom surface portion;
the socket body comprises a support portion being in contact with an intermediate portion of a surface, facing outward of the recess, of the first spring piece;
when an upper part, above the support portion, of the first spring piece is elastically deformed outward of the recess, the support portion serves as a fulcrum so that a lower part, below the fulcrum, of the first spring piece is elastically deformed inward of the recess; and
the support portion is provided at a position facing the pressing portion of the spring member.

11. A socket connector comprising:
a socket body having a recess adapted to receive therein a connection object;
a plurality of contacts disposed at a bottom surface portion of the recess; and
a spring member disposed on a side of the recess, wherein the spring member comprises:
an engaging portion adapted to lock and provisionally hold the connection object at a first position spaced apart from the bottom surface portion; and
a pressing portion adapted to position the connection object at a predetermined position of the recess at a second position closer to the bottom surface portion than the first position.

12. The socket connector according to claim 11, wherein the spring member comprises:
a first spring piece rising from a bottom surface portion side of the recess; and
a second spring piece being continuous with the first spring piece and extending to the bottom surface portion side of the recess through a folded-back portion, and
wherein the second spring piece faces the recess and is formed with the engaging portion and the pressing portion.

13. The socket connector according to claim 12, wherein the spring member further comprises a third spring piece being continuous with an end portion, on the bottom surface portion side, of the first spring piece and extending parallel to the bottom surface portion and the third spring piece has one end fixed to the socket body and is elastically deformable in a direction parallel to the bottom surface portion.

14. The socket connector according to claim 13, wherein the socket body comprises a support portion being in contact with an intermediate portion of a surface, facing outward of the recess, of the first spring piece and, when an upper part, above the support portion, of the first spring piece is elastically deformed outward of the recess, the support portion serves as a fulcrum so that a lower part, below the fulcrum, of the first spring piece is elastically deformed inward of the recess.

15. The socket connector according to claim 14, wherein the support portion is provided at a position facing the pressing portion of the spring member.

16. The socket connector according to claim 11, wherein the spring member is provided on one side of the recess and a positioning reference surface is provided on another side of the recess, the positioning reference surface being adapted to be pressed with a peripheral portion of the connection object by the pressing portion of the spring member, thereby positioning the connection object at the predetermined position of the recess.

17. The socket connector according to claim 16, wherein the positioning reference surface is provided with an engaging projection which the connection object engages in a detaching direction and which cooperates with the engaging portion of the spring member to provisionally hold the connection object.

18. The socket connector according to claim 16, wherein the connection object has a flange portion at the peripheral portion and the flange portion engages the engaging portion and/or the engaging projection and is pressed by the pressing portion so as to be positioned at the predetermined position of the recess.

19. The socket connector according to claim 6, wherein the spring member comprises:
a first spring piece rising from a bottom surface portion side of the recess;
a second spring piece being continuous with the first spring piece and extending to the bottom surface portion side of the recess through a folded-back portion, and
a third spring piece being continuous with an end portion, on the bottom surface portion side, of the first spring piece and extending parallel to the bottom surface portion.

20. The socket connector according to claim 19, wherein:
the second spring piece faces the recess and is formed with the engaging portion and the pressing portion;
the third spring piece has one end fixed to the socket body and is elastically deformable in a direction parallel to the bottom surface portion;
the socket body comprises a support portion being in contact with an intermediate portion of a surface, facing outward of the recess, of the first spring piece;
when an upper part, above the support portion, of the first spring piece is elastically deformed outward of the recess, the support portion serves as a fulcrum so that a lower part, below the fulcrum, of the first spring piece is elastically deformed inward of the recess; and
the support portion is provided at a position facing the pressing portion of the spring member.

* * * * *